US009714975B2

(12) United States Patent
Suica et al.

(10) Patent No.: US 9,714,975 B2
(45) Date of Patent: Jul. 25, 2017

(54) THREE-PHASE RECEPTACLE ELECTRICAL TESTER

(71) Applicant: Hubbell Incorporated, Shelton, CT (US)

(72) Inventors: Samuel Thomas Suica, Las Vegas, NV (US); Stephen Michael Liscinsky, III, Stratford, CT (US)

(73) Assignee: Hubbell Incorporated, Shelton, CT (US)

( * ) Notice: Subject to any disclaimer, the term of this patent is extended or adjusted under 35 U.S.C. 154(b) by 0 days.

(21) Appl. No.: 14/508,852

(22) Filed: Oct. 7, 2014

(65) Prior Publication Data

US 2016/0097802 A1    Apr. 7, 2016

(51) Int. Cl.
*G01R 31/04*  (2006.01)
*G01R 19/145*  (2006.01)
*G01R 31/02*  (2006.01)

(52) U.S. Cl.
CPC ......... *G01R 31/041* (2013.01); *G01R 19/145* (2013.01); *G01R 31/026* (2013.01)

(58) Field of Classification Search
CPC .................. G01R 31/04–31/048; G01R 19/145
USPC ....................................................... 324/508
See application file for complete search history.

(56) References Cited

U.S. PATENT DOCUMENTS

| 4,885,532 | A | 12/1989 | Macey |
| 4,929,887 | A | 5/1990 | Robitaille et al. |
| 6,462,555 | B1 | 10/2002 | Schaefer |
| 6,982,558 | B2 | 1/2006 | Bryndzia et al. |
| 7,030,624 | B1 | 4/2006 | Love |
| 7,068,038 | B2 | 6/2006 | Mason et al. |
| 7,164,273 | B2 * | 1/2007 | Bailey ............... G01R 19/2513 324/508 |
| 7,248,056 | B2 * | 7/2007 | Waldschmidt ....... G01R 31/041 324/133 |
| 7,528,609 | B2 * | 5/2009 | Savicki, Jr. .......... H01R 25/003 324/508 |
| 7,944,212 | B2 * | 5/2011 | Radle ................... G01R 31/045 324/508 |
| 8,325,050 | B1 | 12/2012 | Schlachter |
| 2005/0176286 | A1 | 8/2005 | Waldschmidt |
| 2009/0160663 | A1 * | 6/2009 | Silverman ............ H02H 11/002 324/508 |
| 2012/0268136 | A1 * | 10/2012 | Lee ........................ G01R 31/04 324/508 |

OTHER PUBLICATIONS

Martindale Electric Company Ltd., PC104/PC105 3-Phase Socket Tester Instruction Manual, 2012, Martindale Electric Company Ltd., viewed on Mar. 5, 2016, http://docs-europe.electrocomponents.com/webdocs/11c6/0900766b811c6764.pdf.*
PCT International Search Report and Written Opinion dated Jan. 11, 2016 from corresponding Application No. PCT/US15/54366, 15 pages.

* cited by examiner

*Primary Examiner* — Melissa Koval
*Assistant Examiner* — Rahul Maini
(74) *Attorney, Agent, or Firm* — Wissing Miller LLP (57) ABSTRACT

A receptacle testing device for testing the wiring condition of three phase receptacles is disclosed. The receptacle testing device may be used for performing a quick check of the wiring of three phase receptacles to assess that power is present at the correct terminals within the receptacle, and that the neutral and ground wires are properly wired.

26 Claims, 7 Drawing Sheets

THREE-PHASE RECEPTACLE ELECTRICAL TESTER

BACKGROUND

Field

The present disclosure relates to electrical receptacle testers generally, and more specifically to three-phase electrical receptacle testers that test for certain power conditions relating to the wiring condition of a three phase receptacle.

Description of the Related Art

The use of equipment to determine or test the condition of different residential, commercial and industrial electrical receptacles is known in the art. Some receptacle testers are generally configured for use in association with single phase power sources, such as household standard 110 volt receptacles. To quickly test certain conditions of such single phase receptacles, plug-in type devices have been developed where an installer can insert the device into a receptacle and the device will provide indications whether power is or is not supplied to the receptacle, and whether the wiring polarity of the single phase receptacle is correct or incorrect. It is believed that no such plug-in type device is available on the market that is capable of testing a three phase receptacle to permit the installer quickly test certain electrical conditions related to the wiring of the three phase receptacle and the power supplied to the receptacle.

BRIEF SUMMARY

The present disclosure relates generally to receptacle testing devices for testing the wiring condition of three phase receptacles. The receptacle testing device according to the present disclosure may be used to perform a quick check of the wiring of three phase receptacles to assess that power is present at the correct terminals within the receptacle, and that the neutral and ground wires are properly wired.

In one embodiment, the receptacle testing device includes a housing preferably configured to be hand-held, an electrical connection assembly, and a testing assembly. The electrical connection assembly is preferably positioned at least partially within the housing and includes a plurality of prongs extending at least partially from the housing and configured for insertion into a three phase receptacle. In one embodiment, the plurality of prongs includes five prongs, where a first prong corresponds to a line 1 phase, a second prong corresponds to a line 2 phase, a third prong corresponds to a line 3 phase, a fourth prong corresponds to a neutral, and a fifth prong corresponds to a ground.

The testing assembly is preferably connected to the housing and electrically coupled to the plurality of prongs, such that when the prongs are inserted into a live three phase receptacle the testing assembly is capable of testing at least one electrical condition relative to the receptacle wiring and provide an indication of the condition detected. Examples of the at least one electrical condition include a normal condition, an open neutral condition, and open ground condition, and a reverse wiring condition.

The testing assembly includes a test circuit, preferably on a printed circuit board, having a plurality of terminal ends, where each terminal end is electrically connected to one of the plurality of prongs, and an indicator assembly for providing the indication of the condition detected. The indicator assembly may include a plurality of light emitting diodes and at least one illumination window, or a plurality of light emitting diodes and a plurality of illumination windows, where each illumination window corresponds to one of the plurality of light emitting diodes. In an alternative embodiment, the indicator assembly may include a display device, such as an LCD display, for providing, for example, a text message of the condition detected, or an audible device, such as a speaker, for providing an audible message of the condition detected.

In an alternative embodiment, the receptacle testing device includes a housing, an electrical connection assembly positioned at least partially within the housing and having a plurality of prongs extending at least partially from the housing and configured for insertion into a three phase receptacle, and a testing assembly connected to the housing and electrically coupled to the plurality of prongs, such that when the prongs are inserted into a live three phase receptacle the testing assembly tests for a plurality of electrical conditions relative to the receptacle wiring and provide an indication of the condition detected. Examples of the conditions tested include a normal condition, an open neutral condition, an open ground condition, and a reverse wiring condition. The reverse wiring condition may include a line 1 phase and ground reverse wiring condition, a line 2 phase and ground reverse wiring condition, a line 3 phase and ground reverse wiring condition, a line 1 phase and neutral reverse wiring condition, a line 2 phase and neutral reverse wiring condition, and a line 3 phase and neutral reverse wiring condition.

In this embodiment, the testing assembly includes a test circuit, preferably on a printed circuit board, having a plurality of terminal ends, where each terminal end is electrically connected to one of the plurality of prongs, and an indicator assembly for providing the indication of the condition detected. The indicator assembly may include a plurality of light emitting diodes and at least one illumination window, or alternatively a plurality of light emitting diodes and a plurality of illumination windows, where each illumination window corresponds to one of the plurality of light emitting diodes. As another alternative, the indicator assembly may be in the form of a display device, such as a LCD display, of an audio device, such as a speaker.

BRIEF DESCRIPTION OF THE DRAWINGS

The figures depict embodiments for purposes of illustration only. One skilled in the art will readily recognize from the following description that alternative embodiments of the structures and methods illustrated herein may be employed without departing from the principles described herein, wherein.

DETAILED DESCRIPTION

Figure 1:
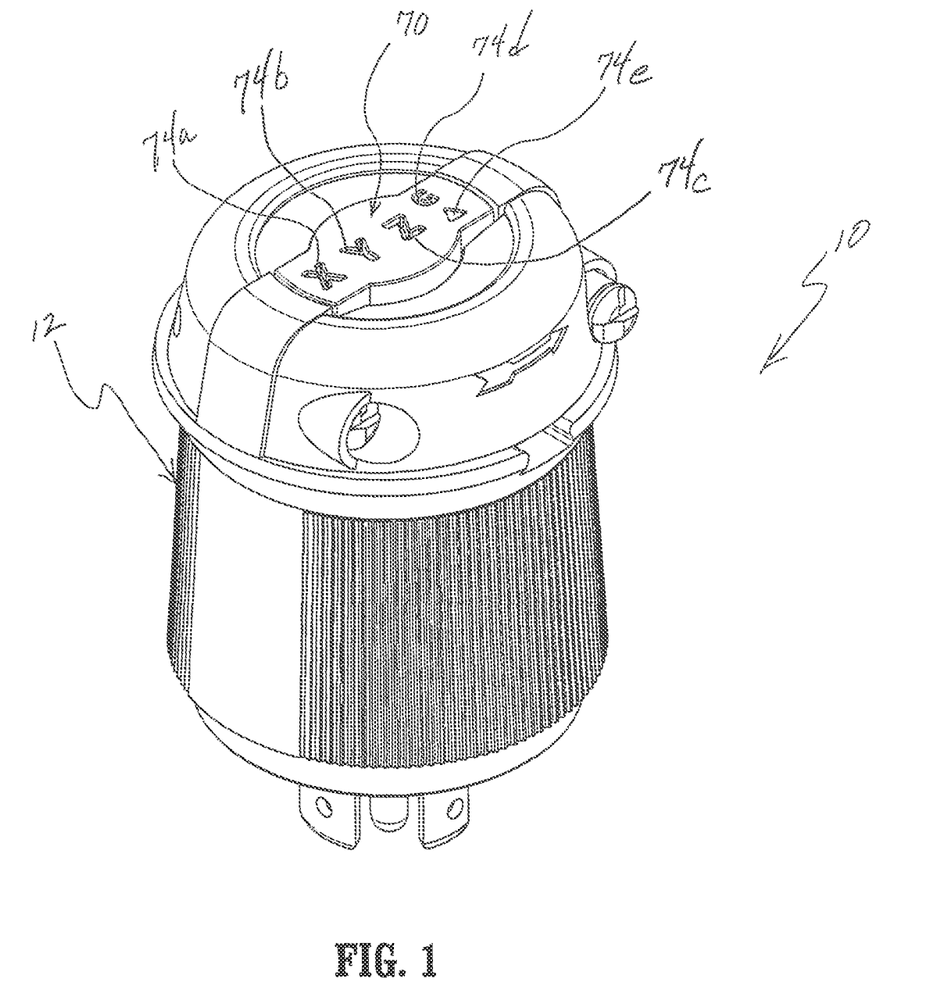
FIG. 1 is a perspective view of a three phase receptacle testing device according to an embodiment of the present disclosure.

The present disclosure provides a three-phase (3 phase) receptacle testing device for use with 3 phase receptacles, including 3 phase locking style receptacles. Referring to FIG. 1, the 3 phase receptacle testing device 10 according to the present disclosure, which may also be referred to herein as a receptacle testing device, includes a housing 12, an electrical connection assembly 14 and testing assembly 16.

Figure 2:
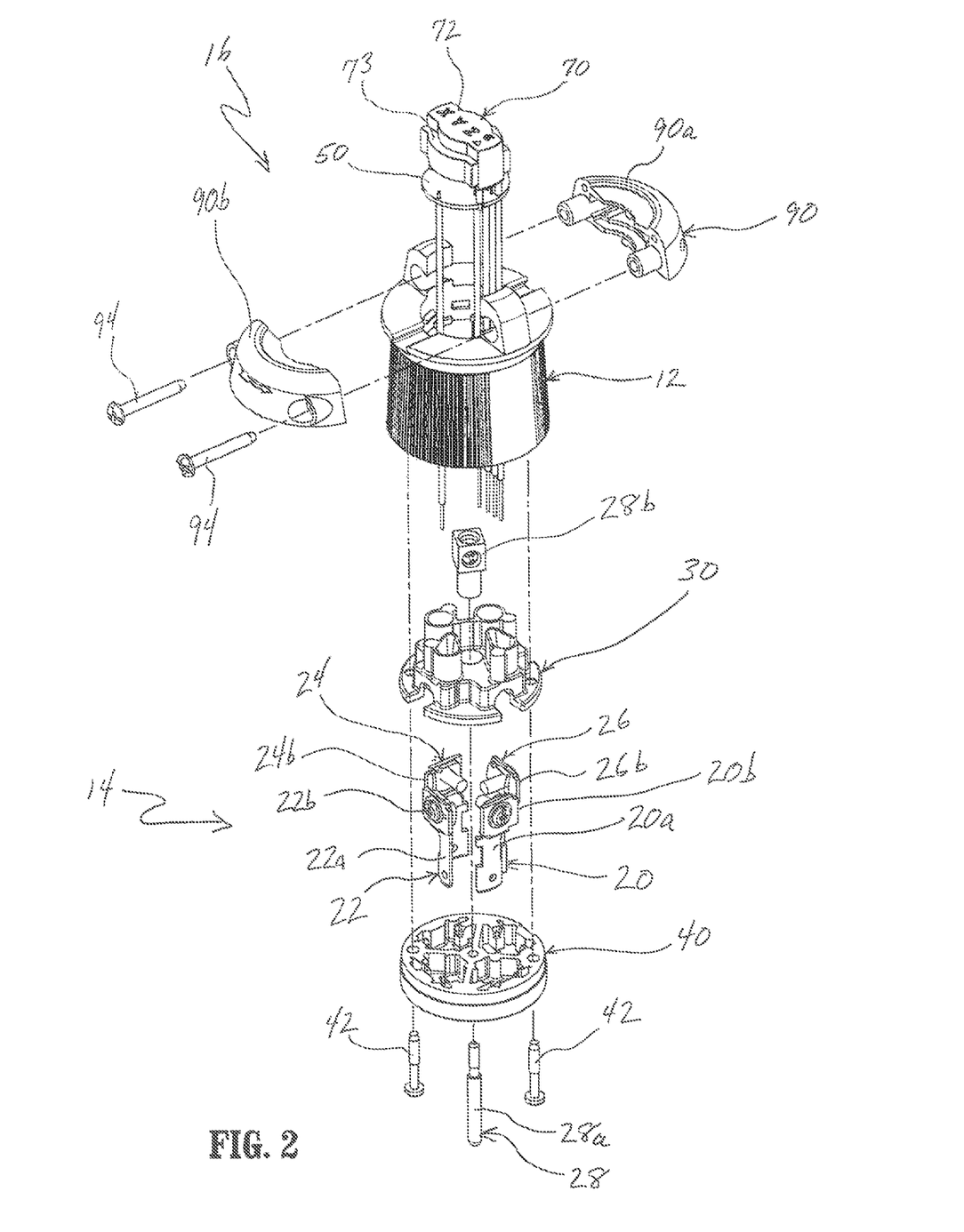
FIG. 2 is an exploded view of the three phase receptacle testing device of FIG. 1.

Referring to FIG. 2, the electrical connection assembly 14 is fitting at least partially within a hollow region of the housing 12, and includes multiple electrical prongs 20, 22, 24, 26 and 28, a prong holding member 30, and a prong positioning member 40. Preferably, the housing is sized to be held in the hand of a user and is ergonomically configured for repetitive use.

Each electrical prong includes a blade 20a, 22a, 24a, 26a and 28a for insertion into a compatible receptacle, and a connector 20b, 22b, 24b, 26b, and 28b for connection to a wire lead extending into the electrical connection assembly 14 from the testing section 16. Preferably, the multiple electrical prongs are compatible with NEMA WD-6 style plugs for use with NEMA WD-6 receptacles. Further, the prongs shown in FIGS. 2 and 3 may include locking type blades in accordance with the NEMA WD-6 standard, and are configured to be inserted into a compatible locking type receptacle. However, other style plugs may be utilized in the receptacle testing device 10 for use with receptacles and connectors that conform to the other style electrical prong configurations.

Figure 3:
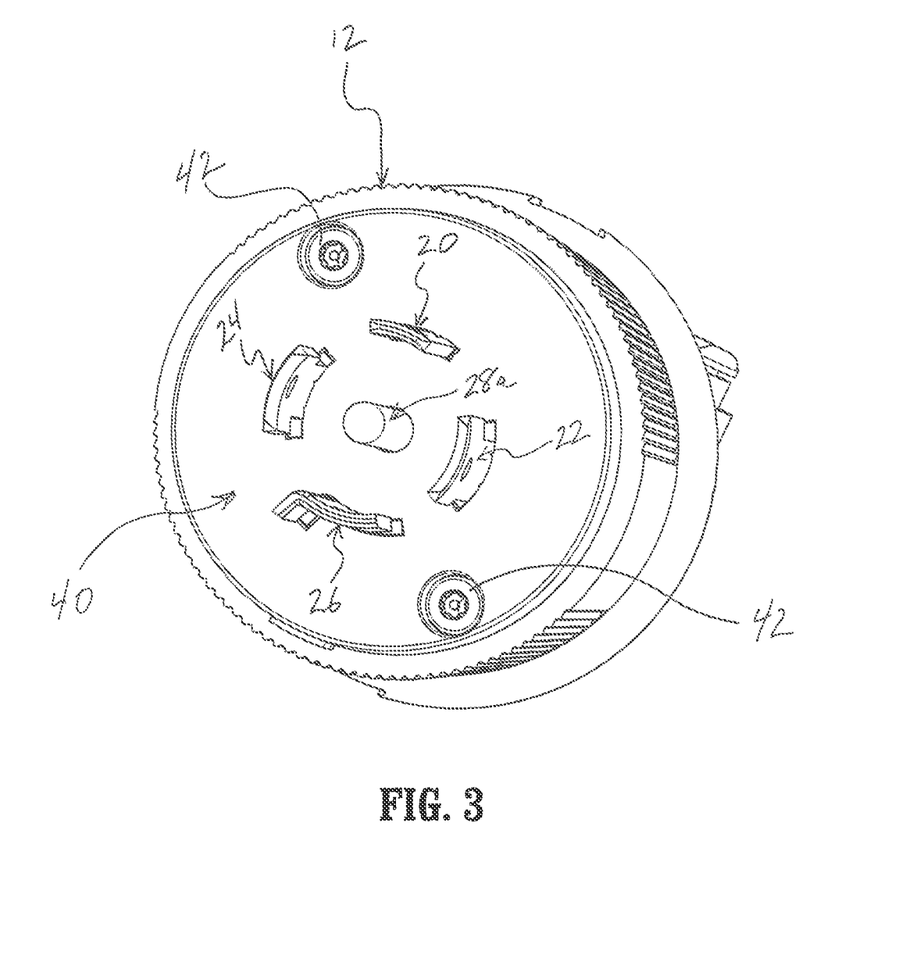
FIG. 3 is an elevational view of the three phase receptacle testing device of FIG. 1 illustrating a locking style blade configuration.

In the embodiment shown in FIGS. 1-3, there are five electrical prongs configured in a NEMA WD-6 compatible plug configuration, where one prong 20 is for a line 1 power (or hot) connection, one prong 22 is for a line 2 power (or hot) connection, one prong 24 is for a line 3 power (or hot) connection, one prong 26 is for a neutral connection, and one prong 28 is for a ground connection. It should be noted that for three phase power, in for example a Wye configuration, each hot line is for one of the three phases of power, where the line 1 phase power may also be represented as phase X, the line 2 phase power may also be represented as phase Y, and the line 3 phase power may also be represented as phase Z.

Continuing to refer to FIGS. 2 and 3, the prong holding member 30 of the electrical connection assembly 14 fits within the housing 12 and is configured to support each prong such that the receptacle testing device 10 can withstand regular insertion into and removal from a compatible receptacle without damaging the prongs or associated wire connections with the device 10. The prong holding member 30 is configured so that the connector 20b, 22b, 24b, 26b and 28b of each prong is accessible to receive the appropriate wire lead from the testing section 16, and to tighten the wire lead to the connector. The prong holding member 30 is also configured so that the blades 20a, 22a, 24a, 26a and 28a of each prong extend away from the prong holding member 30 toward the prong positioning member 40 and out of the housing 12 for future insertion into a receptacle.

The prong positioning member 40 is configured to receive each blade so that the blades extend through openings within the prong positioning member 40 and are positioned to mate with a compatible receptacle, as shown in FIG. 3. The prong positioning member 40 is secured to the housing using screws 42 that screw into holes in the housing.

Figure 7:
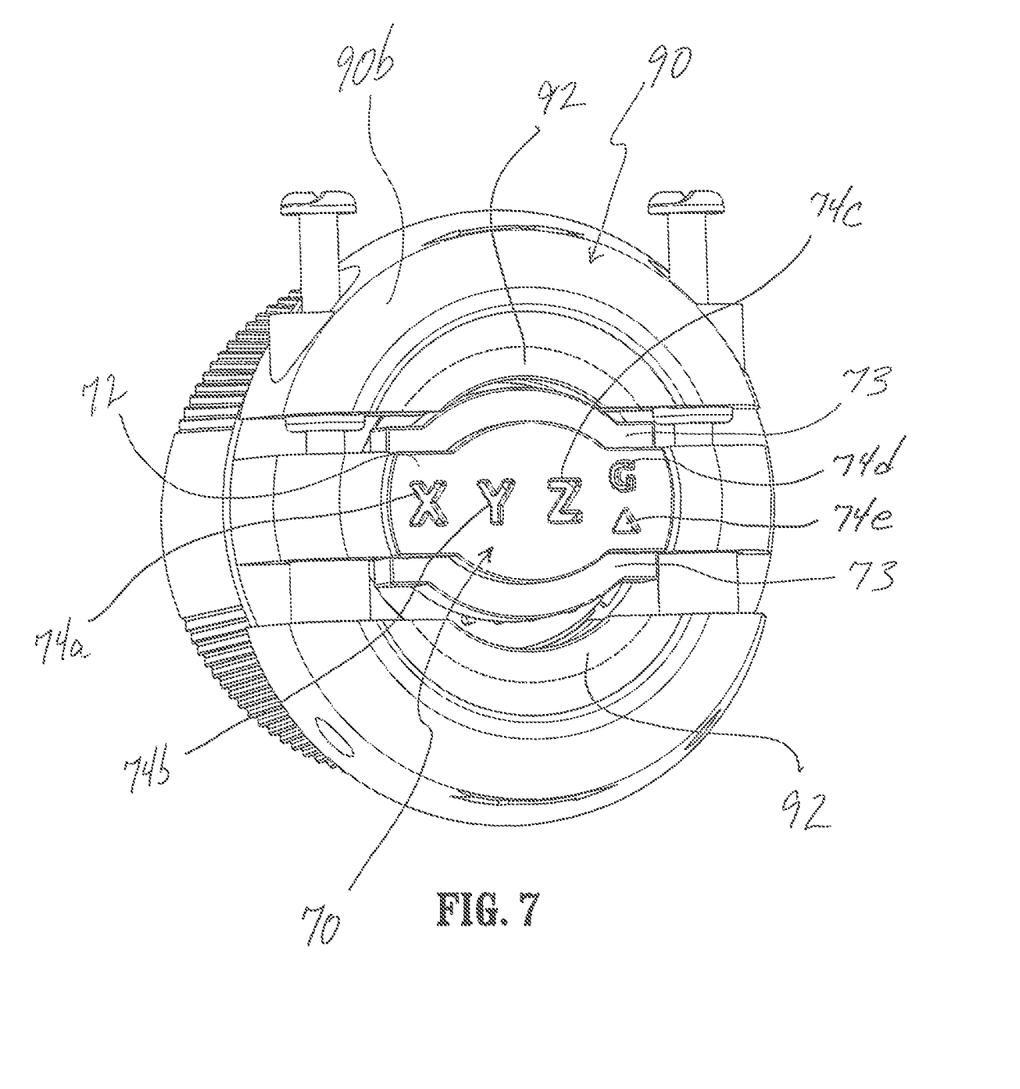
FIG. 7 is a perspective view of the three phase receptacle testing device of FIG. 1, illustrating an indicator assembly and a securing assembly.

The testing assembly 16 includes test circuitry preferably provided on printed circuit board 50, an indicator assembly 70 positioned adjacent the printed circuit board (PCB) 50 and used to provide a visible indication of a detected electrical condition, and a securing assembly 90 that secures the printed circuit board 50 and indicator assembly 70 at least partially within and to the housing 12. The test circuitry includes resistors, diodes and multiple indicators, such as colored light emitting diodes (LED) lights, the number of which depends upon the electrical conditions the receptacle testing device 10 is designed to test. In the embodiments of FIGS. 1, 2 and 7, the test circuitry has 5 LEDs in a circuit that is configured to test for one or more electrical conditions and illuminate one or more of the LEDs indicative of the one or more electrical conditions tested. Alternatively, the multiple indicators may be in the form of a display device, such as a conventional LCD display and supporting logic that provides a text message of the condition detected. In another alternative embodiment, the multiple indicators may be in the form of an audible indicator, such as a conventional speaker or piezoelectric sound generator and supporting logic or circuitry capable of providing an audio or audible indication of the condition detected. Examples of the electrical conditions that may be tested include, but are not limited to the following conditions; 1) the presence of power on the three phases, 2) the presence of a proper or improper ground connection, 3) the presence of a proper or improper neutral connection, and 4) the presence of a reverse wiring connection.

Figure 8:
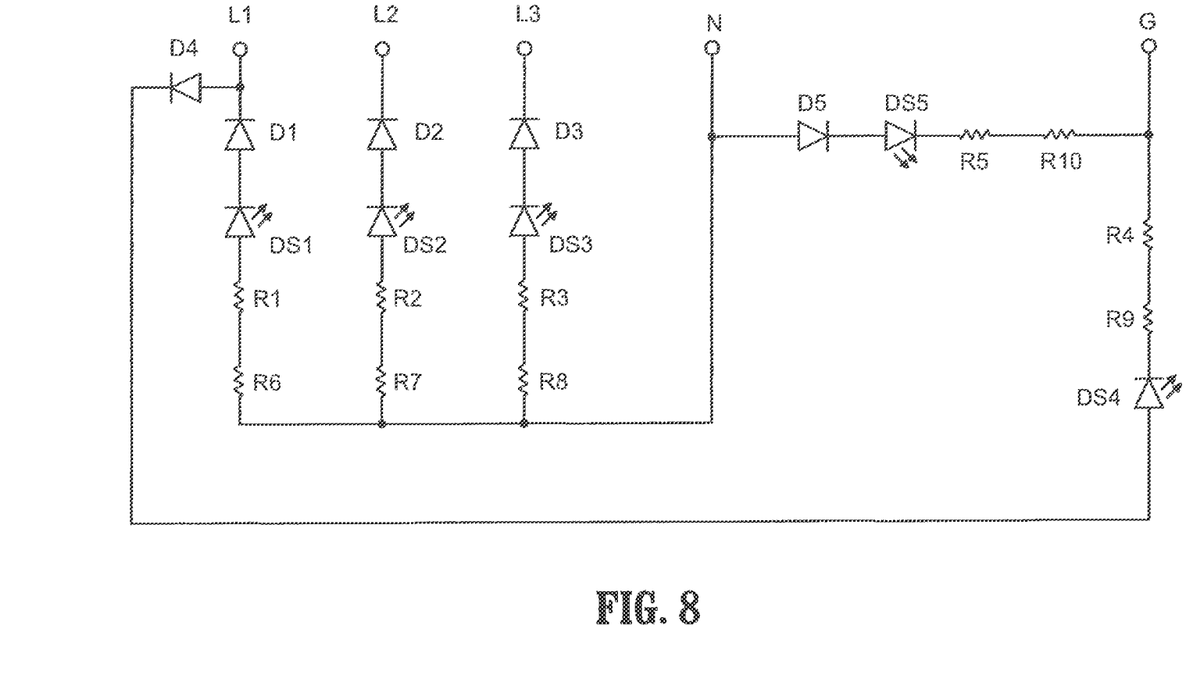
FIG. 8 is an exemplary circuit diagram for the three phase receptacle testing device according to the present disclosure.

FIG. 8 provides an exemplary circuit diagram for the test circuitry on the PCB 50 and used in the embodiments of FIGS. 1, 2 and 7. The test circuit includes a number of terminal ends L1, L2, L3, N and G representing line 1, line 2, line 3, neutral and ground respectively. The terminal ends have wire leads connected thereto which extend from the PCB 50 into the electrical connection assembly 14 and connect to the connection end 20b, 22b, 24b, 26b and 28b of a respective prong (seen in FIG. 2). Using conventional wiring standards, the wire leads for the terminal ends L1, L2, and L3 may be color coded black, red and blue to indicate hot leads, the wire lead for the terminal end N may be color coded white to indicate a neutral lead, and the wire lead for the terminal end G may be color coded green to indicate a ground lead.

Using this exemplary circuit of FIG. 8 and on the condition that a receptacle that the receptacle testing device 10 is inserted into is properly wired, when power is applied to the L1 terminal, diode D1 turns on (on the negative half cycle) so that current flows through LED DS1 to illuminate the LED and through resistors R1 and R6 to the neutral. When DS1 illuminates the tested condition that line 1 power is properly connected within the receptacle is true. Similarly, when power is applied to the L2 terminal end, diode D2 turns on (on the negative half cycle) so that current flows through LED DS2 to illuminate the LED, and through resistors R2 and R7 to the neutral. When DS2 illuminates the tested condition that line 2 power is properly connected within the receptacle is true. Similarly, when power is applied to the L3 terminal end, diode D3 turns on (on the negative half cycle) so that current flows through LED DS3 to illuminate the LED, and through resistors R3 and R8 to the neutral. When DS3 illuminates the tested condition that line 3 power is properly connected within the receptacle is true. In addition, when power is applied to the L1 terminal end, diode D4 turns on (on the positive half cycle) so that current flows through LED DS4 to illuminate the LED and through resistors R4 and R9 to the ground. When DS4 illuminates the tested condition that the ground is properly connected within the receptacle is true. In this embodiment, LEDs DS1-DS4 are preferably green in color.

However, if in the receptacle under test one of the hot lines were reversed with the ground wire such that power would be applied the G terminal end, then diode D5 would turn on (on the negative half cycle) so that current flows through LED DS5 to illuminate the LED and through resistors R5 and R10 to the neutral. When DS5 illuminates and depending upon whether DS1, DS2, DS3 and/or DS4 illuminate, the tested condition that the ground and a hot line are reversed is detected. If in the receptacle under test one of the hot lines were reversed with the neutral wire such that power would be applied the N terminal end, then diode D5 would turn on (on the positive half cycle) so that current flows through LED DS5 (i.e., the reverse wiring LED) to illuminate the LED and through resistors R5 and R10 to the ground. When DS5 illuminates and depending upon whether DS1, DS2, DS3 and/or DS4 illuminate, the tested condition that the neutral and a hot line are reversed is detected. In this embodiment, LED DS5 is preferably red in color. A more detailed description of the conditions and corresponding LED illumination patterns will be described below with reference to Table 1.

Figure 4:
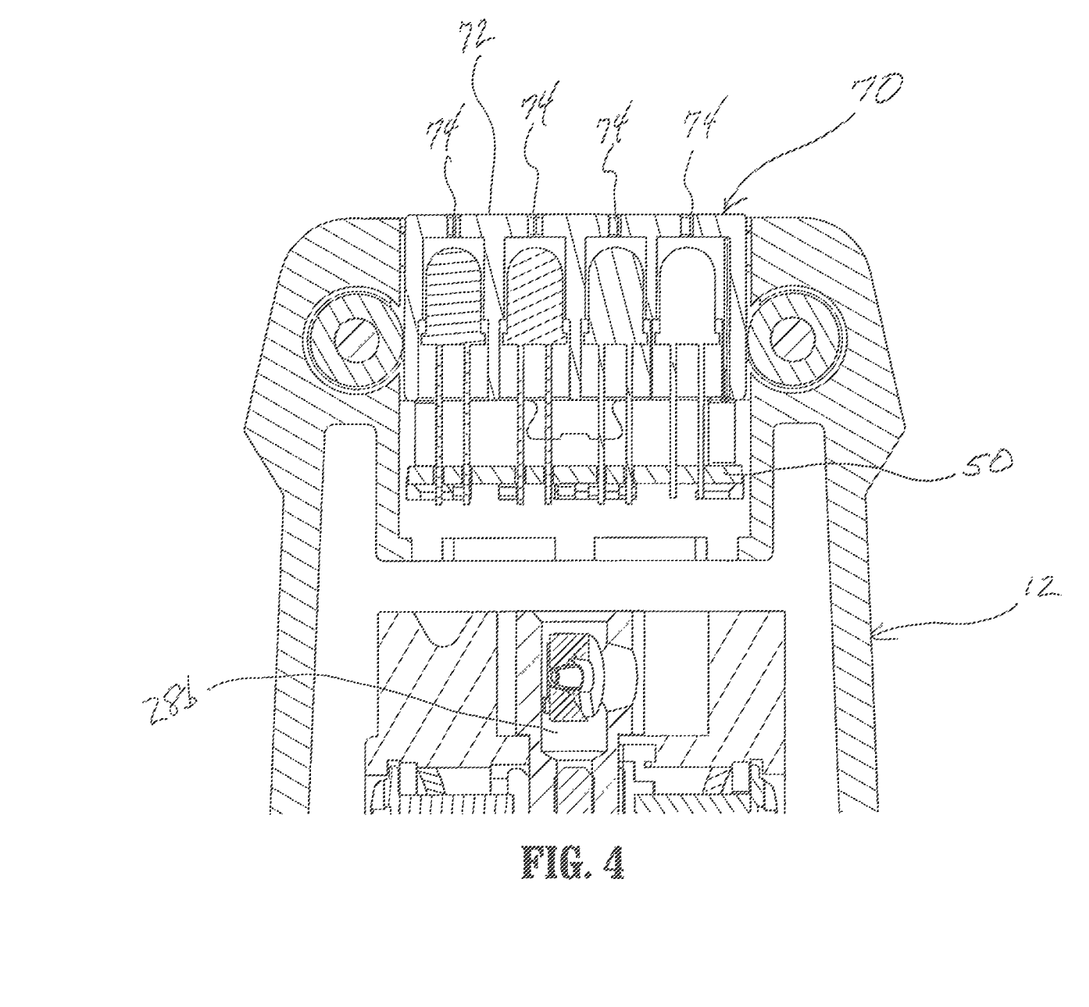
FIG. 4 is a partial cross-sectional view of the three phase receptacle testing device of FIG. 1, illustrating an embodiment of an indicator assembly where multiple indicators can be viewed from an exterior of the device.
Figure 5:
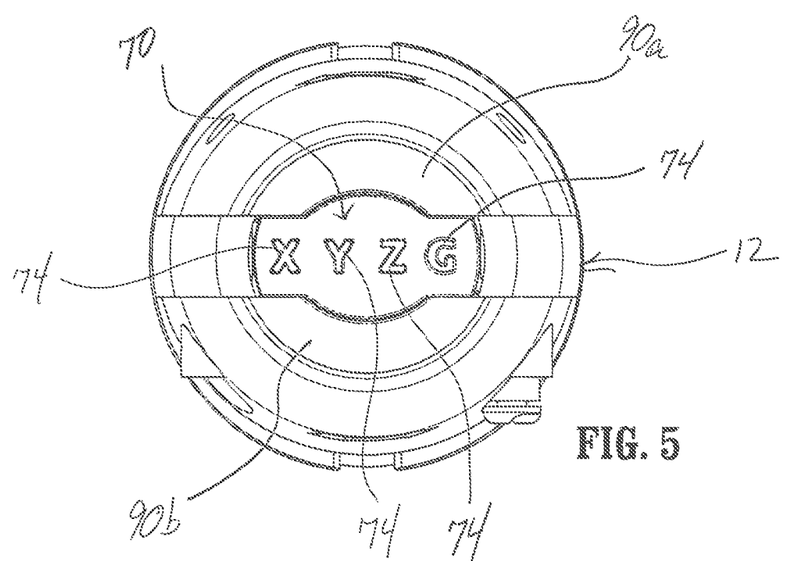
FIG. 5 is an elevational view of the three phase receptacle testing device of FIG. 1, illustrating another embodiment of the indicator assembly.

Referring now to FIGS. 2, 4 and 7, the indicator assembly 70 includes a housing 72 and one or more illumination windows 74. The indicator housing 72 includes two notches 73 (seen in FIG. 7) used to secure the indicator assembly 70 to the housing 12 as will be described below. The indicator assembly housing 72 is configured to be positioned adjacent the PCB 50 such that indications from the multiple indicators, e.g., light emitted by the 5 LEDs, can be visible through the illumination windows 74. In this exemplary embodiment, above each LED is an illumination window to allow light emitted from the LED to be visible to the person using the receptacle testing device 10. Illumination window 74a relates to the line 1 power connection (X phase corresponding to DS1), illumination window 74b relates to the line 2 power connection (Y phase corresponding to DS2), illumination window 74c relates to the line 3 power connection (Z phase corresponding to DS3), and illumination window 74d relates to the ground connection corresponding to DS4. Illumination window 74e is represented by the ▲ symbol and corresponds to DS5 and relates to a reverse wiring condition. As will be explained in more detail below with reference to Table 1, the indications from the LEDs represent the electrical conditions being tested by the receptacle testing device 10.

Figure 6:
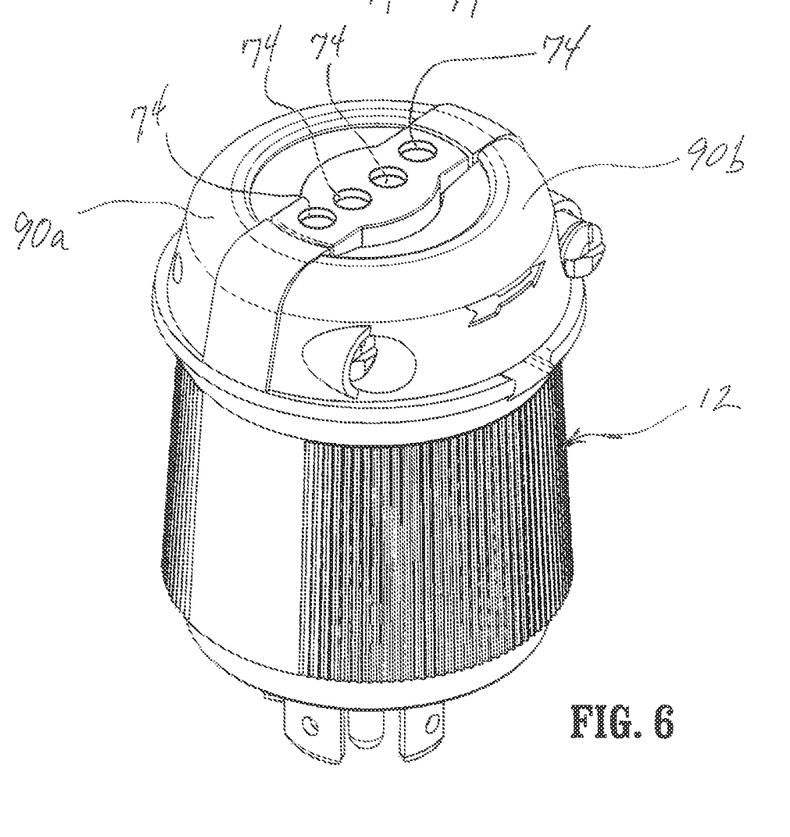
FIG. 6 is a perspective view of the three phase receptacle testing device of FIG. 1, illustrating another embodiment of the indicator assembly.

In the embodiments shown in FIGS. 1, 4, 5 and 7, the illumination windows 74 are molded directly into the indicator assembly 70 with a LED below the molded letters or symbols "X" "Y" "Z" "G" and "▲". In another embodiment, seen in FIG. 6, the LEDs may be exposed to the exterior of the indicator assembly housing 72, such that the openings in the indicator assembly housing acts as the illumination windows. In another embodiment (not shown), the LEDs may be exposed to the exterior of the indicator assembly housing 72 and a plastic window is applied over the LEDs and secured to the indicator assembly housing to form the illumination windows.

In the exemplary embodiments shown in FIGS. 2 and 7, the securing assembly 90 is a two-piece clamping structure that includes first clamping member 90a and second clamping member 90b. Each clamping member has an extension lip 92 configured to engage notches 73 in the indicator assembly housing 72, such that when the two piece clamping structure is assembled over the housing 12, the extension lips 92 engage the notches 73 on the indicator assembly housing 70. When the two piece clamping structure is connected together using screws 94, the PCB 50 and indicator assembly 70 (i.e., the testing assembly 16) are secured at least partially within and to the housing 12.

In operation and referring to the embodiment of FIGS. 1 and 7, and the circuit of FIG. 8, Table 1 below is an exemplary condition testing table that lists multiple conditions and the indicators that illuminate to represent that the condition is true. When a user of the receptacle testing device 10 inserts the device into a compatible receptacle (i.e., a receptacle under test), one or more of the indicators may illuminate, and per the table below will indicate if the wiring of the receptacle is correct, i.e., normal, or an open wire condition exists and the potential cause of that condition, or if a reverse wiring condition exists and the potential cause of that condition.

TABLE 1

| CONDITION | Indicator X | Indicator Y | Indicator Z | Indicator G | Indicator ▲ |
|---|---|---|---|---|---|
| Correct | X | Y | Z | G | |
| Open Neutral | | | | G | |
| Open Ground | X | Y | Z | | |
| Open X | | Y | Z | | |
| Open Y | X | | Z | G | |
| Open Z | X | Y | | G | |
| X & N Rev. | X | Y | Z | | ▲ |
| Y & N Rev. | X | Y | Z | G | ▲ |
| Z & N Rev. | X | Y | Z | G | ▲ |
| X & G Rev. | | Y | Z | G | ▲ |
| Y & G Rev. | X | | Z | G | ▲ |
| Z G & Rev. | X | Y | | G | ▲ |

More specifically, if a receptacle under test is properly wired, when the receptacle testing device is inserted into the receptacle under test, the LEDs for each phase will illuminate, such that light will be visible from the "X", "Y", and "Z" illumination windows. In addition, the LED for the ground will illuminate, such that light will be visible from the "G" illumination window. Preferably, these LEDs are green in color. Thus, the condition detected is normal.

If when the receptacle testing device is inserted into the receptacle under test, and only the LED for the ground illuminates, such that light is visible only from the "G" illumination window, an open neutral condition was detected. In an open neutral condition, power from line 1 causes the ground LED to illuminate, but power from the phases cannot return to the source through the N terminal to the neutral, such that the phase LEDs cannot not illuminate. In addition, the reverse wiring LED (corresponding to DS5) did not illuminate so that a reverse wiring condition was not detected. Thus, the condition detected is an open neutral.

If when the receptacle testing device is inserted into the receptacle under test, and only the LEDs for each phase illuminate, such that light is visible from the "X", "Y", and "Z" illumination windows, an open ground condition was detected. In an open ground condition, power from line 1 cannot cause the ground LED to illuminate, but power from the phases can return to the source through the N terminal end to the neutral, such that the phase LEDs illuminate. In addition, the reverse wiring LED did not illuminate so that a reverse wiring condition was not detected. Thus, the condition detected is an open ground.

If when the receptacle testing device is inserted into the receptacle under test, and only the LEDs for the line 2 ("Y" phase) and the line 3 ("Z" phase) illuminate, such that light is visible from the "Y" and "Z" illumination windows, then an open hot condition was detected on the line 1 ("X" phase). In an open line 1 hot condition, power from line 1 cannot cause the line 1 phase and ground LEDs to illuminate, but power from the line 2 and line 3 phases can return to the source through the N terminal end to the neutral, such that the line 2 and line 3 phase LEDs illuminate. In addition, the reverse wiring LED did not illuminate so that a reverse wiring condition was not detected. Thus, the condition detected is an open line 1 hot condition.

If when the receptacle testing device is inserted into the receptacle under test, and only the LEDs for line 1 ("X" phase), line 3 ("Z" phase), and the ground illuminate, such that light is visible from the "X", "Z" and "G" illumination windows, then an open hot condition was detected on the line 2 ("Y" phase). In an open line 2 hot condition, power from line 2 cannot cause the line 2 phase LED to illuminate, but power from the line 1 and line 3 phases can return to source through the N terminal end to the neutral, such that the line 2 and line 3 phase LEDs illuminate. Power from the line 1 phase can also return to the source through the G terminal end to ground so that the ground LED illuminates. In addition, the reverse wiring LED did not illuminate so that a reverse wiring condition was not detected. Thus, the condition detected is an open line 2 hot condition.

Similarly, if when the receptacle testing device is inserted into the receptacle under test, and only the LEDs for line 1 ("X" phase), line 2 ("Y" phase), and ground illuminate, such that light is visible from the "X", "Y" and "G" illumination windows, then an open hot condition was detected on the line 3 ("Z" phase). In an open line 3 hot condition, power from line 3 cannot cause the line 3 phase LED to illuminate, but power from the line 1 and line 2 phases can return to the source through the N terminal end to the neutral, such that the line 2 and line 3 phase LEDs illuminate. Power from the line 1 phase can also return to the source through the G terminal end to ground so that the ground LED illuminates. In addition, the reverse wiring LED did not illuminate so that a reverse wiring condition was not detected. Thus, the condition detected is an open line 3 hot condition.

If when the receptacle testing device is inserted into the receptacle under test, and only the LEDs for each phase and the LED for the reverse wiring connection (corresponding to DS5) illuminate, such that light is visible from the "X", "Y", "Z" and "▲" illumination windows, then a reverse wiring condition was detected where the line 1 ("X" phase) and the neutral connection are reversed. Preferably, the phase LEDs are green in color and the reverse wiring LED is red in color. In this reverse wiring condition, power on three phases returns to the source through the N terminal end to the neutral, which is improperly connected to the L1 terminal end within the improperly wired receptacle under test, thereby illuminating the phase LEDs. In addition, line 1 power, which is improperly connected to the N terminal end within the improperly wired receptacle under test, passes through the reverse wiring LED and returns to the source through the G terminal end to ground, thereby illuminating the reverse wiring LED. No power passes from the L1 terminal end through the ground connection so that the ground LED does not illuminate. Thus, the condition detected is a reverse wiring condition between the line 1 hot and the neutral.

If when the receptacle testing device is inserted into the receptacle under test, and the LEDs for each phase and the LEDs for ground and reverse wiring connections illuminate (i.e., all the LEDs illuminate), such that light is visible from the "X", "Y", "Z", "G" and "▲" illumination windows, then a reverse wiring condition was detected where either the line 2 ("Y" phase) or line 3 ("Z" phase) and the neutral connection are reversed. In this reverse wiring condition, power on three phases return to the source through the neutral, which is improperly connected to either the L2 or L3 terminal end within the improperly wired receptacle under test, thereby illuminating the phase LEDs. In addition, line 2 or line 3 power passes through the reverse wiring LED and returns to the source through the G terminal end to ground, thereby illuminating the reverse wiring LED. Line 1 power also passes through the ground LED and returns to the source through the G terminal end to ground, thereby illuminating the ground LED. Thus, the condition detected is a reverse wiring condition between either the line 2 or line 3 hot and the neutral.

If when the receptacle testing device is inserted into the receptacle under test, and only the LEDs for line 2 ("Y" phase), line 3 ("Z" phase), ground and reverse wiring illuminate, such that light is visible from the "Y", "Z", "G" and "▲" illumination windows, then a reverse wiring condition was detected where the line 1 ("X" phase) and the ground connection are reversed. In this reverse wiring condition, power on the line 2 and line 3 phases return to the source through the N terminal end to neutral, thereby illuminating the line 2 and line 3 phase LEDs. In addition, line 1 power, which is improperly applied to the G terminal end within the improperly wired receptacle under test, passes through the reverse wiring LED and returns to the source through the N terminal end to the neutral, thereby illuminating the reverse wiring LED. Line 1 power, which is improperly applied to the G terminal end within the improperly wired receptacle under test, also passes through the ground LED and returns to the source through the ground, which is improperly connected to the L1 terminal end within the improperly wired receptacle under test, thereby illuminating the ground LED. Thus, the condition detected is a reverse wiring condition between the line 1 hot and the ground.

If when the receptacle testing device is inserted into the receptacle under test, and only the LEDs for line 1 ("X" phase), line 3 ("Z" phase), ground and reverse wiring illuminate, such that light is visible from the "X", "Z", "G" and "▲" illumination windows, then a reverse wiring condition was detected where the line 2 ("Y" phase) and the ground connection are reversed. In this reverse wiring condition, power on the line 1 and line 3 phases return to the source through the N terminal end to neutral, thereby illuminating the line 1 and line 3 phase LEDs. In addition, line 1 power also passes through the ground LED and returns to the source through the N terminal end via DS5 and D5 to neutral, thereby illuminating the ground LED. Line 2 power, which is improperly connected to the G terminal end within the improperly wired receptacle under test, passes through the reverse wiring LED and returns to the source through the N terminal end to neutral, thereby illuminating the reverse wiring LED. Thus, the condition detected is a reverse wiring condition between the line 2 hot and the ground.

If when the receptacle testing device is inserted into the receptacle under test, and only the LEDs for line 1 ("X" phase), line 2 ("Y" phase), ground and reverse wiring illuminate, such that light is visible from the "X", "Y", "G" and "▲" illumination windows, then a reverse wiring condition was detected where the line 3 ("Z" phase) and the ground connection are reversed. In this reverse wiring condition, power on the line 1 and line 2 phases return to the source through the N terminal end to neutral, thereby illuminating the line 1 and line 2 phase LEDs. In addition, line 1 power also passes through the ground LED and returns to the source through the N terminal end via DS5 and D5 to neutral, thereby illuminating the ground LED. Line 3 power, which is improperly connected to the G terminal end within the improperly wired receptacle under test, passes through the reverse wiring LED and returns to the source through the N terminal end to neutral, thereby illuminating the reverse wiring LED. Thus, the condition detected is a reverse wiring condition between the line 3 hot and the ground.

The receptacle testing device according to the present disclosure may be used for performing a quick check of the wiring of three phase receptacles to assess that power is present at the correct terminals within the receptacle, and that the neutral and ground wires are properly wired. However, it will be understood that various modifications can be made to the embodiments of the present disclosure herein without departing from the spirit and scope thereof. Therefore, the above description should not be construed as limiting the disclosure, but merely as embodiments thereof. Those skilled in the art will envision other modifications within the scope and spirit of the invention as defined by the claims appended hereto.

What is claimed is:

1. A receptacle testing device for testing the wiring condition of live three phase receptacles, comprising:
   a housing;
   an electrical connection assembly positioned at least partially within the housing and including a plurality of prongs extending at least partially from the housing and configured for insertion into a three phase receptacle;
   a testing assembly connected to the housing and electrically coupled to the plurality of prongs such that when the prongs are inserted into a live three phase receptacle the testing assembly is capable of testing at least one electrical condition relative to the receptacle wiring, wherein the at least one electrical condition includes a normal condition, an open neutral condition, an open ground condition, an open hot condition and a reverse wiring condition;
   an indicator assembly for providing an indication of the condition detected, wherein the indicator assembly comprises:
      a first illumination window representing a line 1 phase;
      a second illumination window representing a line 2 phase;
      a third illumination window representing a line 3 phase;
      a fourth illumination window representing electrical ground; and
      a fifth illumination window shaped to represent an open neutral condition; and
   wherein when the open hot condition is detected in the line 1 phase the second and third illumination windows are illuminated, wherein when the open hot condition is detected in the line 2 phase the first and third illumination windows are illuminated, and wherein when the open hot condition is detected in the line 3 phase the first and second illumination windows are illuminated.

2. The receptacle testing device according to claim 1, wherein the testing assembly comprises a test circuit having a plurality of terminal ends wherein each terminal end is electrically connected to one of the plurality of prongs.

3. The receptacle testing device according to claim 2, wherein the test circuit is on a printed circuit board.

4. The receptacle testing device according to claim 1, wherein the indicator assembly comprises a first light emitting diode associated with the first illumination window, a second light emitting diode associated with the second illumination window, a third light emitting diode associated with the third illumination window, a fourth light emitting diode associated with the fourth illumination window and a fifth light emitting diode associated with the fifth illumination window.

5. The receptacle testing device according to claim 1, wherein the indicator assembly comprises an audible device.

6. The receptacle testing device according to claim 5, wherein the audible device comprises a speaker.

7. The receptacle testing device according to claim 1, wherein the housing is configured to be hand-held.

8. The receptacle testing device according to claim 1, wherein the plurality of prongs comprises five prongs, wherein a first prong corresponds to the line 1 phase, a second prong corresponds to the line 2 phase, a third prong corresponds to the line 3 phase, a fourth prong corresponds to a neutral, a fifth prong corresponds to the electrical ground.

9. The receptacle testing device according to claim 1, wherein when the normal condition is detected the first, second, third and fourth illumination windows are illuminated, wherein when the open neutral condition is detected the fourth illumination window is illuminated, and wherein when the open ground condition is detected the first, second and third illumination windows are illuminated.

10. The receptacle testing device according to claim 1, wherein when the reverse wiring condition is detected between the line 1 phase and the electrical ground the second, third, fourth and fifth illumination windows are illuminated, wherein when the reverse wiring condition is detected between the line 2 phase and the electrical ground the first, third, fourth and fifth illumination windows are illuminated, and wherein when the reverse wiring condition is detected between the line 3 phase and the electrical ground the first, second, fourth and fifth illumination windows are illuminated.

11. The receptacle testing device according to claim 1, wherein when the reverse wiring condition is detected between the line 1 phase and a neutral the first, second, third and fifth illumination windows are illuminated, and wherein when the reverse wiring condition is detected between the line 2 phase or the line 3 phase and the neutral the first, second, third, fourth and fifth illumination windows are illuminated.

12. A receptacle testing device for testing the wiring condition of live three phase receptacles, comprising:
   a housing;
   an electrical connection assembly positioned at least partially within the housing and including a plurality of prongs extending at least partially from the housing and configured for insertion into a three phase receptacle;
   a testing assembly connected to the housing and electrically coupled to the plurality of prongs such that when the prongs are inserted into a live three phase receptacle the testing assembly tests for a plurality of electrical conditions relative to the receptacle wiring, wherein the plurality of electrical conditions tested include a normal condition, an open neutral condition, an open ground condition, an open hot condition, and a reverse wiring condition;

an indicator assembly for providing a visual indication of the condition detected, wherein the indicator assembly comprises:
  a first illumination window representing a line 1 phase;
  a second illumination window representing a line 2 phase;
  a third illumination window representing a line 3 phase;
  a fourth illumination window representing electrical ground; and
  a fifth illumination window shaped to represent an open neutral condition; and
wherein when the open hot condition is detected in the line 1 phase the second and third illumination windows are illuminated, wherein when the open hot condition is detected in the line 2 phase the first and third illumination windows are illuminated, and wherein when the open hot condition is detected in the line 3 phase the first and second illumination windows are illuminated.

13. The receptacle testing device according to claim 12, wherein the testing assembly comprises a test circuit having a plurality of terminal ends wherein each terminal end is electrically connected to one of the plurality of prongs.

14. The receptacle testing device according to claim 13, wherein the test circuit is on a printed circuit board.

15. The receptacle testing device according to claim 12, wherein the indicator assembly comprises a first light emitting diode associated with the first illumination window, a second light emitting diode associated with the second illumination window, a third light emitting diode associated with the third illumination window, a fourth light emitting diode associated with the fourth illumination window and a fifth light emitting diode associated with the fifth illumination window.

16. The receptacle testing device according to claim 12, wherein the indicator assembly comprises an audible device.

17. The receptacle testing device according to claim 16, wherein the audible device comprises a speaker.

18. The receptacle testing device according to claim 12, wherein the housing is configured to be hand-held.

19. The receptacle testing device according to claim 12, wherein the plurality of prongs comprises five prongs, wherein a first prong corresponds to the line 1 phase, a second prong corresponds to the line 2 phase, a third prong corresponds to the line 3 phase, a fourth prong corresponds to a neutral, a fifth prong corresponds to the electrical ground.

20. The receptacle testing device according to claim 12, wherein when the normal condition is detected the first, second, third and fourth illumination windows are illuminated, wherein when the open neutral condition is detected the fourth illumination window is illuminated, and wherein when the open ground condition is detected the first, second and third illumination windows are illuminated.

21. The receptacle testing device according to claim 12, wherein when the reverse wiring condition is detected between the line 1 phase and a neutral the first, second, third and fifth illumination windows are illuminated, and wherein when the reverse wiring condition is detected between the line 2 phase or the line 3 phase and the neutral the first, second, third, fourth and fifth illumination windows are illuminated.

22. The receptacle testing device according to claim 12, wherein when the reverse wiring condition is detected between the line 1 phase and the electrical ground the second, third, fourth and fifth illumination windows are illuminated, wherein when the reverse wiring condition is detected between the line 2 phase and the electrical ground the first, third, fourth and fifth illumination windows are illuminated, and wherein when the reverse wiring condition is detected between the line 3 phase and the electrical ground the first, second, fourth and fifth illumination windows are illuminated.

23. A receptacle testing device for testing the wiring condition of live three phase receptacles, comprising:
  a housing;
  an electrical connection assembly positioned at least partially within the housing and including a plurality of prongs extending at least partially from the housing and configured for insertion into a three phase receptacle;
  a testing assembly connected to the housing and electrically coupled to the plurality of prongs such that when the prongs are inserted into a live three phase receptacle the testing assembly is capable of testing at least one electrical condition relative to the receptacle wiring, wherein the at least one electrical condition includes a normal condition, an open neutral condition, an open ground condition, an open hot condition and a reverse wiring condition;
  an indicator assembly for providing an indication of the condition detected, wherein the indicator assembly comprises:
    a first illumination window representing a line 1 phase;
    a second illumination window representing a line 2 phase;
    a third illumination window representing a line 3 phase;
    a fourth illumination window representing electrical ground; and
    a fifth illumination window shaped to represent an open neutral condition; and
  wherein when the reverse wiring condition is detected between the line 1 phase and the electrical ground the second, third, fourth and fifth illumination windows are illuminated, wherein when the reverse wiring condition is detected between the line 2 phase and the electrical ground the first, third, fourth and fifth illumination windows are illuminated, and wherein when the reverse wiring condition is detected between the line 3 phase and the electrical ground the first, second, fourth and fifth illumination windows are illuminated.

24. The receptacle testing device according to claim 23, wherein when the reverse wiring condition is detected between the line 1 phase and a neutral the first, second, third and fifth illumination windows are illuminated, and wherein when the reverse wiring condition is detected between the line 2 phase or the line 3 phase and the neutral the first, second, third, fourth and fifth illumination windows are illuminated.

25. A receptacle testing device for testing the wiring condition of live three phase receptacles, comprising:
  a housing;
  an electrical connection assembly positioned at least partially within the housing and including a plurality of prongs extending at least partially from the housing and configured for insertion into a three phase receptacle;
  a testing assembly connected to the housing and electrically coupled to the plurality of prongs such that when the prongs are inserted into a live three phase receptacle the testing assembly tests for a plurality of electrical conditions relative to the receptacle wiring, wherein the plurality of electrical conditions tested include a normal condition, an open neutral condition, an open ground condition, an open hot condition, and a reverse wiring condition;

an indicator assembly for providing a visual indication of the condition detected, wherein the indicator assembly comprises:
a first illumination window representing a line 1 phase;
a second illumination window representing a line 2 phase;
a third illumination window representing a line 3 phase;
a fourth illumination window representing electrical ground; and
a fifth illumination window shaped to represent an open neutral condition; and
wherein when the reverse wiring condition is detected between the line 1 phase and the electrical ground the second, third, fourth and fifth illumination windows are illuminated, wherein when the reverse wiring condition is detected between the line 2 phase and the electrical ground the first, third, fourth and fifth illumination windows are illuminated, and wherein when the reverse wiring condition is detected between the line 3 phase and the electrical ground the first, second, fourth and fifth illumination windows are illuminated.

26. The receptacle testing device according to claim 25, wherein when the reverse wiring condition is detected between the line 1 phase and a neutral the first, second, third and fifth illumination windows are illuminated, and wherein when the reverse wiring condition is detected between the line 2 phase or the line 3 phase and the neutral the first, second, third, fourth and fifth illumination windows are illuminated.

\* \* \* \* \*